United States Patent
Madeley et al.

(10) Patent No.: US 10,753,981 B2
(45) Date of Patent: Aug. 25, 2020

(54) BATTERY ECOSYSTEM SYSTEM AND METHOD

(71) Applicant: Interstate Battery System International, Inc., Dallas, TX (US)

(72) Inventors: Brian Madeley, Dallas, TX (US); Tyler Reeves, Dallas, TX (US); Clifford Sewing, Dallas, TX (US)

(73) Assignee: Interstate Battery System International, Dallas, TX (US)

( * ) Notice: Subject to any disclaimer, the term of this patent is extended or adjusted under 35 U.S.C. 154(b) by 64 days.

(21) Appl. No.: 16/122,689

(22) Filed: Sep. 5, 2018

(65) Prior Publication Data
US 2019/0072615 A1    Mar. 7, 2019

Related U.S. Application Data

(60) Provisional application No. 62/554,262, filed on Sep. 5, 2017.

(51) Int. Cl.
| | |
|---|---|
| *G01R 31/36* | (2020.01) |
| *H01M 10/42* | (2006.01) |
| *G01R 31/385* | (2019.01) |
| *G01R 31/382* | (2019.01) |
| *G01R 31/371* | (2019.01) |
| *H01M 10/48* | (2006.01) |

(52) U.S. Cl.
CPC ........ *G01R 31/385* (2019.01); *G01R 31/371* (2019.01); *G01R 31/382* (2019.01); *H01M 10/425* (2013.01); *H01M 10/4285* (2013.01); *H01M 10/48* (2013.01); *H01M 2010/4278* (2013.01); *H01M 2220/30* (2013.01)

(58) Field of Classification Search
CPC .. G01R 31/385; G01R 31/371; G01R 31/382; H01M 10/425; H01M 10/4285; H01M 2010/4278; H01M 2220/30; H01M 10/48
See application file for complete search history.

(56) References Cited

U.S. PATENT DOCUMENTS

| | | | |
|---|---|---|---|
| 6,624,635 B1* | 9/2003 | Lui ........................ | H02J 7/0022 324/426 |
| 2006/0192564 A1* | 8/2006 | Brown ................. | G06Q 30/012 324/426 |
| 2009/0039835 A1* | 2/2009 | Wolf ...................... | G01R 31/36 320/136 |
| 2011/0246258 A1* | 10/2011 | Cragun .................. | G06Q 30/02 705/7.31 |

(Continued)

*Primary Examiner* — Christopher P McAndrew
*Assistant Examiner* — Zannatul Ferdous
(74) *Attorney, Agent, or Firm* — Kirby Drake

(57) ABSTRACT

A battery ecosystem may provide electronic components including a reserve capacity tester (RCT) module, a handheld battery and electrical system analyzer (handheld tester), a tester charger, a wireless gateway router modem or hub (hub), a printer, wireless tire tread measuring device, a handheld route sales manager device (RSM), a battery monitoring device, and/or serialized labels, and a Sales/Information/POP kiosk. The hub may communicate with the electronic components, and the battery monitor may constantly read input and output information from a battery and communicate it to the hub and the serialized labels may provide a significant amount of information to the battery ecosystem.

18 Claims, 5 Drawing Sheets

(56) References Cited

U.S. PATENT DOCUMENTS

| | | | |
|---|---|---|---|
| 2011/0273181 A1* | 11/2011 | Park | H02J 7/0008 |
| | | | 324/429 |
| 2014/0225620 A1* | 8/2014 | Campbell | G01R 31/382 |
| | | | 324/426 |
| 2014/0374475 A1* | 12/2014 | Kallfelz | H04Q 9/00 |
| | | | 235/375 |
| 2016/0266212 A1* | 9/2016 | Carlo | G01R 31/367 |
| 2017/0206446 A1* | 7/2017 | Lesesky | G06K 19/07764 |

* cited by examiner

BATTERY ECOSYSTEM SYSTEM AND METHOD

The present application hereby claims priority to U.S. Provisional Patent Application No. 62/554,262, filed on Sep. 5, 2017, entitled "BATTERY ECOSYSTEM SYSTEM AND METHOD" which is incorporated herein by reference in its entirety.

TECHNICAL FIELD

The disclosure relates generally to a battery ecosystem, and more specifically, to a battery ecosystem system and method for testing and managing inventory of batteries.

BACKGROUND

Batteries, such as automobile, commercial, powersports, golf car, lawn and garden, etc. batteries, can be tested using a handheld testing device to determine whether the batteries are useable or fail and need to be replaced. A limited amount of data may be transferred from these handheld testing devices to other devices. Limitations of known handheld devices can include, but are not limited to, determining the health of the battery, determining where a new battery can be found, evaluating the specifications of the battery, and communicating data to consumers and/or businesses regarding the battery's performance and specifications. These limitations can cause inaccuracy of test results, increased time to test and replace batteries, and increased expenses associated with testing and replacing batteries.

The current system of replenishing consigned inventory at dealers involves the onsite presence of a Route Sales Manager (RSM) that can physically count the quantity of batteries on a dealer's rack. A consignment model can account for both the breath and depth of a product on the shelf to serve customers. To ensure the accurate type of battery is available on consignment to match the types of cars that dealers service, the type of battery needed can be calculated based on car registrations within a certain zip code. This general formula can be used to determine breath of consignment. Depth of consignment can be determined based on traditional turn rates of batteries, and not based on on-demand and real-time knowledge.

Further, the current system for testing a battery today can require seeing the Cold Cranking Amps (CCA) rating of the battery while the battery is in the engine compartment. Determining the CCA rating can be critical to accurately entering a value into the battery tester or the testing results will not be 100% accurate. Since it is cumbersome to obtain an accurate reading using today's systems, inaccurate numbers are often input into battery testers.

SUMMARY

Embodiments of the present disclosure may provide a battery ecosystem that may include a hub that may be provided to communicate with a battery monitor and/or a handheld tester that may be provided to scan serialized labels. A Reserve Capacity Tester (RCT) module and a wireless tire tread measuring device may be provided to communicate with the handheld tester and mobile devices. The mobile devices may communicate information to the hub directly and then on to consumers and businesses. The battery ecosystem may also include a printer that may be provided to communicate with the hub. The handheld tester may communicate directly with the printer by utilizing a Wi-Fi, Bluetooth, or other similar wireless connection. The battery monitor may constantly read/monitor voltage inputs and outputs information from the battery that is then transferred to the hub when the battery monitoring device is within range of the hub. The hub may also be provided with or connected to a third-party system or device, and the battery monitor may transfer data to mobile devices including, but not limited to, phones, tablets, and third-party devices. The handheld tester may be programmed to automatically order a device or tester supplies, such as a battery, directly from the distributor.

Other embodiments of the present disclosure may provide a method of operating a battery ecosystem. The method of operating the battery ecosystem may provide the steps of communicating information to and from a hub and wirelessly connecting a battery monitor and/or a handheld tester to the hub to send and receive information to and from the hub that would then also be utilized and communicated to the Distributor network where relevant. The method may include constantly reading the information communicated to and from the hub, and the battery monitor may constantly share the information it is gathering while deployed on the battery. The method may include applying serialized labels and RF and/or RFID chips to products and connecting a third-party battery management/inventory system to the hub using a Bluetooth connection. The method may include providing a third-party connection from the hub.

Additional embodiments of the present disclosure may provide a system, as shown and described herein. Further, embodiments of the present disclosure may provide a method, as shown and described herein.

Other technical features may be readily apparent to one skilled in the art from the following drawings, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Embodiments of the present disclosure may generally provide a battery ecosystem system and method. A hub may communicate with a handheld battery and electrical system analyzer (handheld tester) and/or a battery monitor. The battery monitor may constantly read battery voltage information, inputs, and outputs and communicate readings to the hub.

Figure 1:
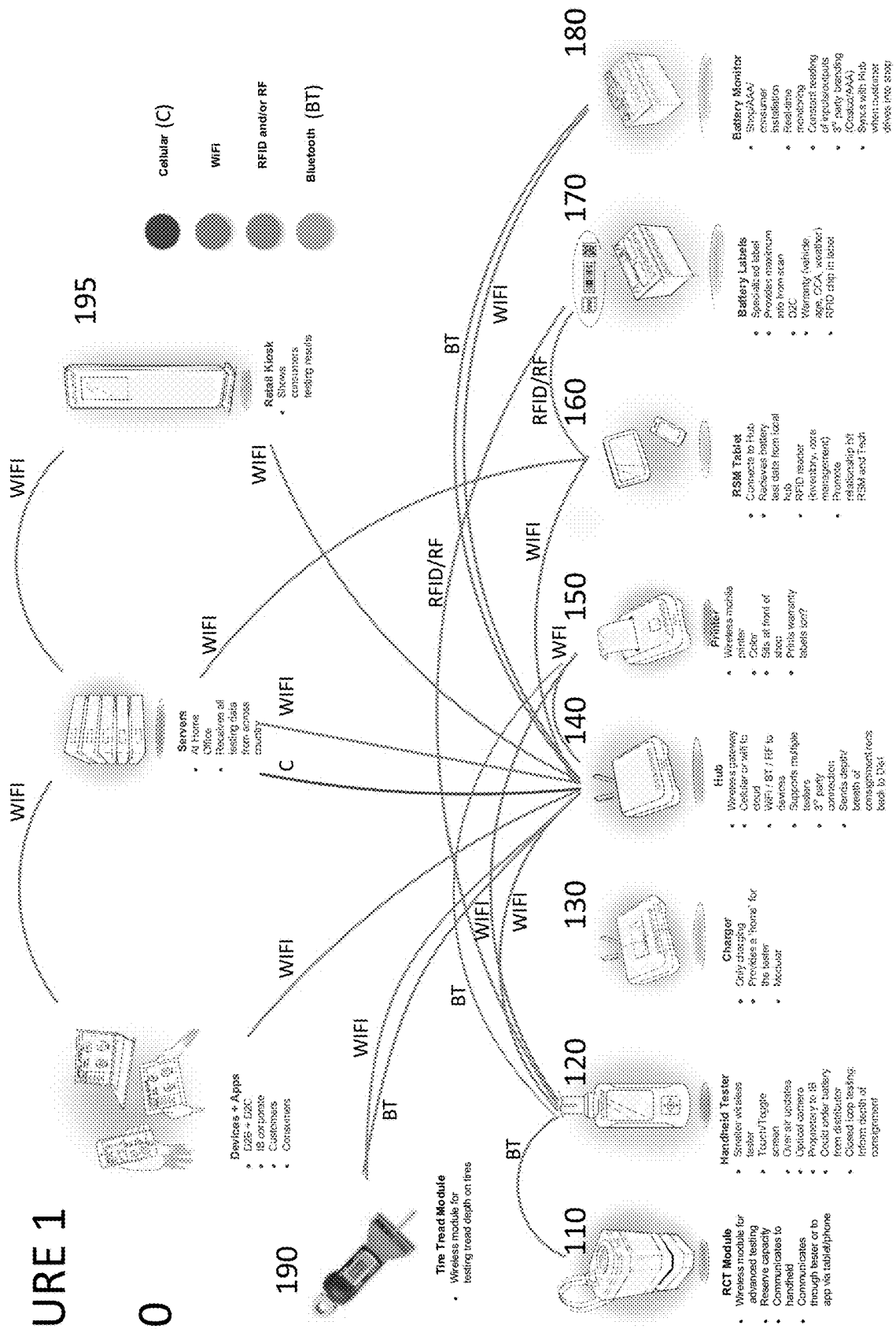
FIG. 1 is a view of a battery ecosystem system and method including a tire tread measuring tool according to an embodiment of the present disclosure.

FIG. 1 depicts battery ecosystem 100 according to embodiments of the present disclosure. Battery ecosystem 100 may provide electronic components including, but not limited to, Reserve Capacity Tester (RCT) module 110, handheld battery and electrical system analyzer (handheld tester) 120, handheld tester base and battery charger 130, wireless gateway router modem or hub (referenced herein as hub) 140, printer 150, Route Sales Manager handheld module (RSM) 160, battery monitor 180, and/or serialized labels 170, wireless tire tread measuring device 190. RCT module 110 may be wireless and may connect to other electronic components using a Bluetooth connection in embodiments of the present disclosure. RCT module 110 may provide a reserve capacity testing capability and cable management by providing a storage area for cords. RCT module 110 may communicate directly and/or indirectly to handheld tester 120 and devices including, but not limited to, a tablet, laptop, a mobile phone, a mobile application, and other devices. It should be appreciated that RCT module 110 may communicate through handheld tester 120 and/or to a mobile application on a tablet or mobile phone.

Handheld tester 120 may directly physically or wirelessly connect with RCT module 110 in embodiments of the present disclosure. Handheld tester 120 may be a compact device that may be easy to carry and may not consume much space. Handheld tester 120 may be wireless and may connect to other electronic components using a wireless connection, which may be through radio-frequency (RF), radio-frequency identification (RFID) or a Wi-Fi connection in embodiments of the present disclosure. Handheld tester 120 may be provided over-the-air updates. Updates may include, but are not limited to, updates to a battery application guide, updates to car VIN identification, automobile recall information, battery location information and diagrams, weather information, training information, battery reset instructions, newer car battery registration instructions, battery barcodes, and/or other information. It should be appreciated that handheld tester 120 may include a touch screen in some embodiments of the present disclosure; however, other input mechanisms may be provided without departing from the present disclosure. It should be appreciated that handheld tester 120 may provide a scanner and/or a camera that may capture information including, but not limited to, vehicle identification numbers (VIN), battery label information, UPC codes, and QR codes, in embodiments of the present disclosure by reading barcodes, optical scan results, UPC, codes, QR codes, and/or other sources of information. Handheld tester 120 may provide a closed loop testing circuit. It should be appreciated that if a battery fails (i.e., does not pass testing) and the battery is replaced, handheld tester 120 may automatically order a battery from a distributor that may be selected by the user and/or specified by another party. Handheld tester 120 may display, email, and/or text historical results from previous battery tests, marketing communications to businesses and consumers, coupon and incentive orders, and education links and videos.

Battery charger 130 may charge a device including, but not limited to, batteries, RCT module 110, and/or printer 150. It should be appreciated that a cloud may receive and/or send information to and from any component in battery ecosystem 100 in embodiments of the present disclosure. It should be appreciated that the cloud may be connected to one or more servers without departing from the present disclosure. It should be appreciated that battery charger 130 may not provide communication technology in some embodiments of the present disclosure.

Hub 140 may connect to other electronic components using a wireless connection or cable, which may be a Bluetooth, RF, RFID, cellular or a Wi-Fi connection in some embodiments of the present disclosure. Hub 140 may be capable of connecting to multiple devices, and battery ecosystem 100 may include a plurality of hubs without departing from the present disclosure. It should be appreciated that hub 140 may offer connectivity to third-party systems or networks in some embodiments of the present disclosure.

Printer 150 may connect to other electronic components within or connected to battery ecosystem 100 using a wireless or wired connection, which may be a Bluetooth or a Wi-Fi connection in embodiments of the present disclosure. It should be appreciated that printer 150 may provide black and white and/or color printing without departing from the present disclosure. It should be appreciated that components may plug into hub 140 when access to electrical outlets are reduced in some embodiments of the present disclosure.

RSM 160 may be handheld and may connect to hub 140 using a wireless connection, which may be a Bluetooth, RF, RFID, or a Wi-Fi connection in some embodiments of the present disclosure. RSM 160 may receive battery data from hub 140 and/or from a plurality of local hubs. Battery data may include inventory information in some embodiments of the present disclosure. RSM 160 may provide an RF and/or RFID reader that may identify a various battery attributes including, but not limited to, batteries rated Cold Cranking Amps (CCA), date of production, production plant and/or reserve capacity minutes.

Battery monitor 180 may constantly read information input and output to and from battery ecosystem 100 in embodiments of the present disclosure. Battery monitor 180 may communicate with other components in battery ecosystem 100 using a wireless connection, which may be a Bluetooth, RF, RFID or a Wi-Fi connection in some embodiments of the present disclosure. Battery monitor 180 may send and/or receive information from hub 140 and/or a mobile device, which may include, but is not limited to, a smartphone, a tablet, and a computer. Real-time monitoring of battery ecosystem 100 may be provided by battery monitor 180 in embodiments of the present disclosure. Constantly reading information input and output to and from hub 140 may be provided by battery monitor 180. It should be appreciated that battery monitor 180 may be utilized or implemented by a third-party without departing from the present disclosure. Battery monitor 180 may measure the current, historical voltage, and other variables associated with the battery in order to determine the state of health (SOH) and state of charge (SOC) of the battery. Battery monitor 180 through the input/output readings may be utilized to diagnose an alternator malfunction and may determine if a customer has voided their battery warranty through abuse of the product. Warranty abuse may be determined through the observance of off-key drain at certain times of the day/night. Off-key drainage may indicate that a door is left open. Off-key drainage that may include an excess amount of drainage may indicate that fluid was introduced into a vehicle's electrical system.

Serialized label 170 may be provided in battery ecosystem 100 and may provide information that may be detected or read from a handheld scanner or handheld tester 120 in some embodiments of the present disclosure. Serialized label 170 may allow a D2C engagement through a consumer's smart phone, tablet, or another device that may read the battery label through a D2C engagement phone application. Serialized label 170 may also include information that may support direct to business (D2B) applications in embodiments of the present disclosure. Serialized label 170 may provide information including, but not limited to, regional data, production location, production date, rated CCA, date sold to dealer, reserve capacity minutes, amp hour ratings, weather data, battery voltage information, battery scan dates via a tester, battery age, and/or vehicle data without departing from the present disclosure. It should be appreciated that serialized label 170 may rotate information through RSM 160. An RF and/or RFID chip may be provided on batteries that may communicate with the handheld scanner, and the RF and/or RFID chip may provide information tied to serialized label 180.

Wireless tire tread measuring device 190 may connect to other electronic components within and/or connected to battery ecosystem 100 using a wireless or wired connection, which may be a Bluetooth or a Wi-Fi connection in embodiments of the present disclosure. Utilizing a laser to scan the tires or depth gauge the wireless tire tread measuring device 190 may provide information including, but not limited to, extent of the wear. Indicating when the tires might need to be replaced.

Figure 2:
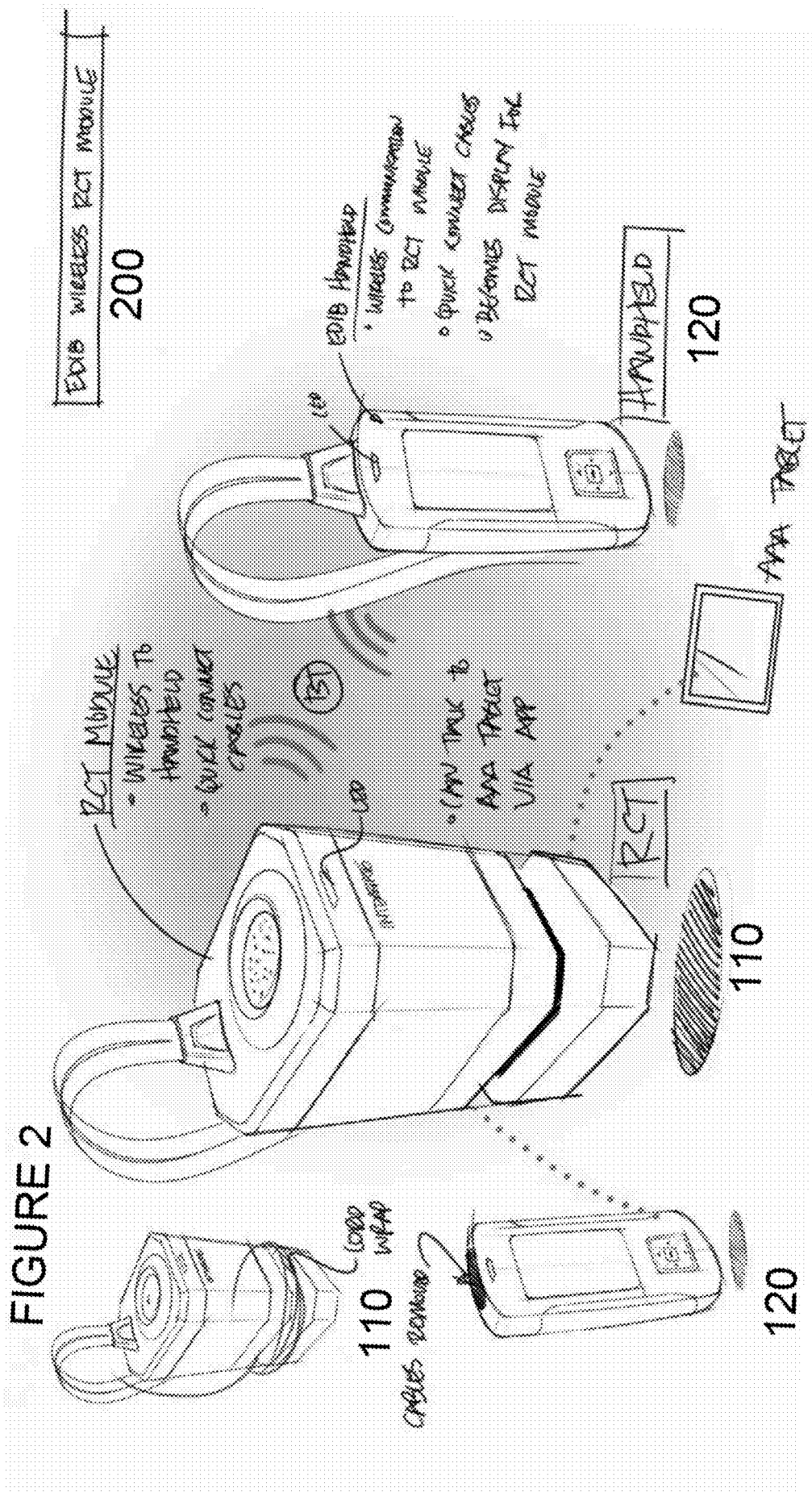
FIG. 2 is a view of an RCT module connected to handheld devices according to an embodiment of the present disclosure.

FIG. 2 depicts wireless RCT module 110 connected to handheld devices 120 according to an embodiment of the present disclosure. RCT module 110 may provide a wireless connection to handheld tester 120 and/or a physical quick-connect connection. The cables also may quick-connect from the device and may be utilized in either the RCT or handheld device 120 in embodiments of the present disclosure. RCT module 110 may include one or more light emitting devices (LEDs) that may indicate handheld device 120 status and may communicate with other devices through application software or an app in embodiments of the present disclosure.

Handheld tester 120 may provide wireless communication to RCT module 110 and/or a physical connection for quick-connect cables in embodiments of the present disclosure. Handheld tester 120 may provide a display for RCT module 110 without departing from the present disclosure. It should be appreciated that RCT module 110 may provide a recess about the exterior of RCT module 110 that may be provided to wrap cords or cables around RCT module 110.

Figure 3:
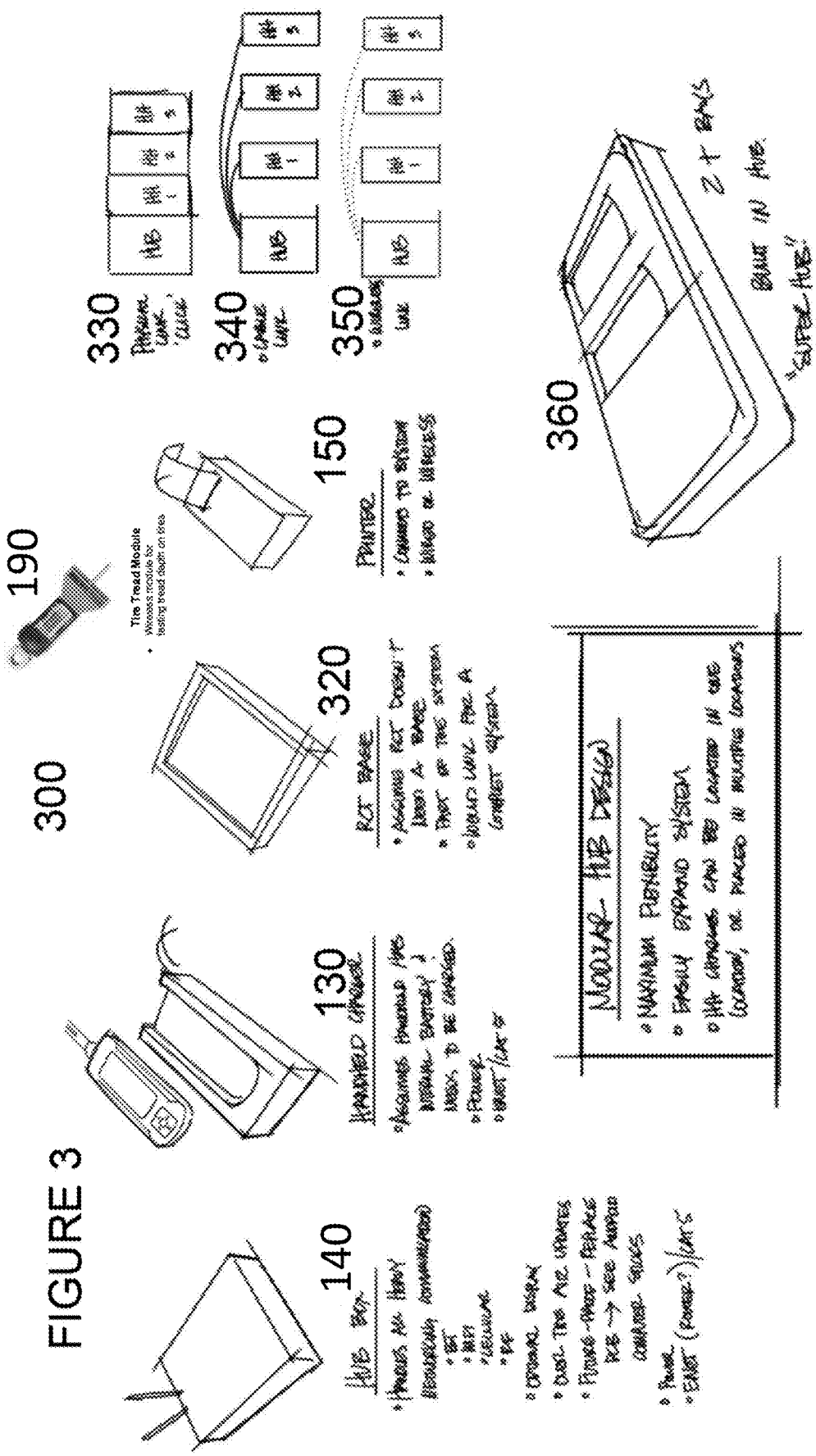
FIG. 3 is a view of a modular hub system including a tire tread measuring tool according to an embodiment of the present disclosure.

FIG. 3 depicts modular hub system 300 according to an embodiment of the present disclosure. Modular hub system 300 may provide hub 140 that may be provided to support heavy networking communication using one or more communication protocols, including but not limited to, Bluetooth, Wi-Fi, cellular, and/or radio frequency signals. It should be appreciated that hub 140 may provide a display without departing from the present disclosure. Hub 140 may provide over-the-air updates in some embodiments of the present disclosure. It should be appreciated that hub 140 may provide Ethernet and/or CAT5 cable connections without departing from the present disclosure.

Battery charger 130 may charge an internal battery that may be recharged in some embodiments of the present disclosure. It should be appreciated that battery charger 130 may provide Ethernet and/or CAT5 cable connections without departing from the present disclosure. It should be appreciated that RCT base 320 may be provided by modular hub system 300 and may link to a computer system without departing from the present disclosure. Printer 150 may connect to modular hub system 300 via a wired and/or wireless connection in embodiments of the present disclosure. Wireless tire tread measuring device 190 may connect to modular hub system 300 via a wired and/or wireless connection in embodiments of the present disclosure. Modular hub system 300 may include physical link 330, cable link 340, and/or wireless link 350. Modular hub system 300 may provide super hub 360 that may include at least two bays and a built-in hub in some embodiments of the present disclosure. Modular hub system 300 may provide maximum flexibility and may easily expand. It should be appreciated that handheld charger 130 may be charged in a specific area of modular hub system 300 or in a plurality of locations throughout modular hub system 300 in embodiments of the present disclosure.

Figure 4:
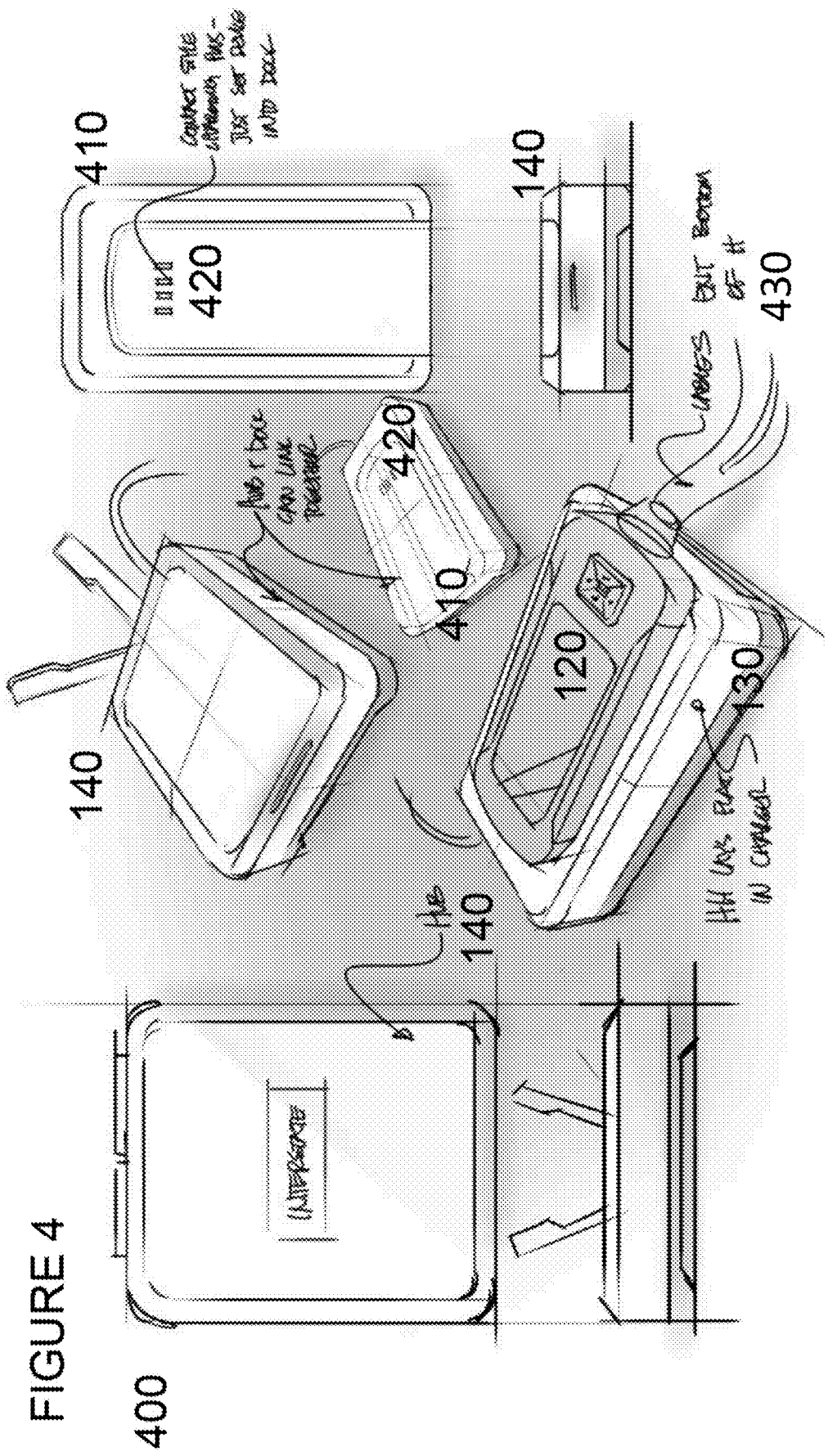
FIG. 4 is a view of a modular hub and docking system according to an embodiment of the present disclosure.

FIG. 4 depicts modular hub and docking system 400 according to an embodiment of the present disclosure. Modular hub and docking system 400 may include hub 140 and dock 410. Hub 140 and dock 410 may link together, and dock 410 may provide pins 420. Pins 420 may charge upon contact with hub 140. Cable 430 may be provided along the bottom of handheld charger 130. Handheld charger 130 may be provided to lay flat on top of charger 130.

Figure 5:
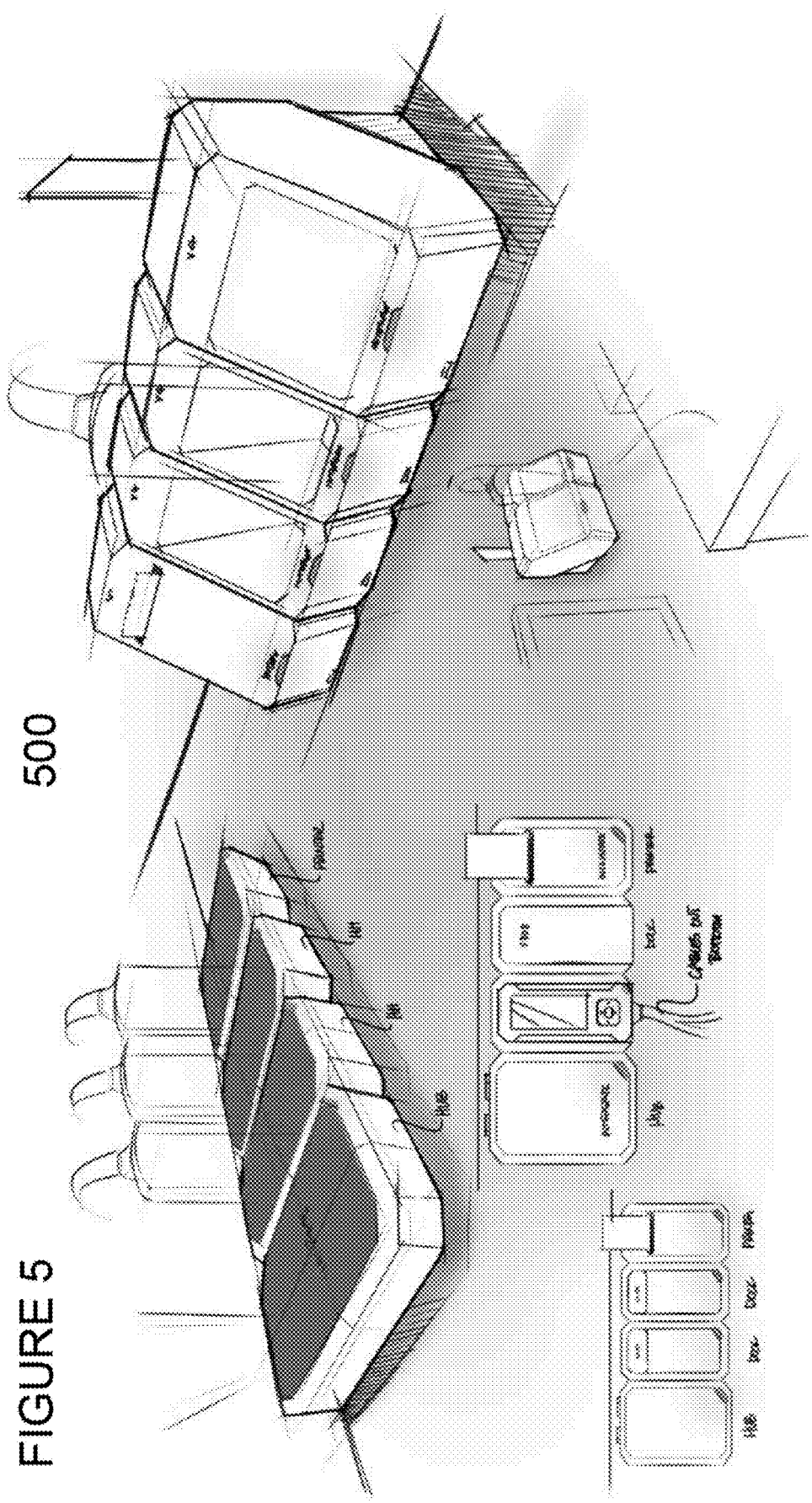
FIG. 5 is a view of modular hub components according to an embodiment of the present disclosure.

FIG. 5 depicts modular hub components 500 according to an embodiment of the present disclosure. Modular hub components 500 may be provided in a central area or in the same room without departing from the present disclosure. It should be appreciated that modular hub components 500 may be provided in separate rooms or different locations without departing from the present disclosure.

Embodiments of the present disclosure may provide an ecosystem that may have advantages over known battery testing systems. For example, an automobile may enter a location to have a battery tested. Through the algorithm that may be utilized with handheld tester 120 (FIGS. 1, 2, and 4), handheld tester 120 may have a closed loop solution for testing a battery and ordering a new battery, if the battery tests poorly or is dead. Upon testing a poor or dead battery, a new battery may be automatically ordered by utilizing a vehicle identification number (VIN), which may be the same VIN associated with previously tested batteries and may reasonably suggest that the battery is a replacement. If the battery is a replacement battery, information associated with the battery may tie directly to a business model of a consignment methodology. Through linking a known replacement battery to a car, information associated with the battery may be communicated from handheld tester 120, to hub 140, to office servers, and then to at least one distributor who may service a primary area of responsibility (PAR). This closed feedback loop may greatly enhance the distributor(s)' ability to manage a depth of consignments at dealer locations. When the battery tests poorly or bad, the RF, RFID tag or another scannable tag may be altered and/or communicated with handheld tester 120 to signify that the battery is tested poorly or bad and/or failed which may tie into a Route Sales Manager (RSM) function, as described below. Further, through scanning the VIN of each vehicle, the vehicle make and model may be discovered. This information may be communicated to hub 140, to office servers, and then communicated back to the at least one distributor. This information may support and enhance a consignment model through providing a breath of consignment choices that may be provided to a dealer base.

It should be appreciated that an application for providing individual serial numbers on a battery through scannable means, such as by utilizing an RF, RFID or other methods, may utilize handheld tester 120 and/or may scan a tool to accurately determine the value of cold-cranking amps (CCA) of the battery when it is installed in an engine compartment that may not be seen, as well as the manufacture date and other tests that may be completed since the lifecycle began for the battery. It should be appreciated that this may greatly increase the reliability/accuracy of the battery test, as the CCA is known to provide accuracy without fail and the battery is accurately measured against itself. Additionally, an encoded manufacture date may enable a warranty calculation to be expediently calculated and may reduce a time period in which testing may be performed. Through the deployment of providing individual and unique identifiers on batteries, a specific battery may be linked to a VIN and/or a customer. It should also be appreciated that directly linking warranty information on a battery to an individual consumer may be performed by utilizing a database repository and/or an online interactive website. Given that the battery will have a scannable tag identifying the specific battery tagged, the RSM handheld device 140 can then complete accurate inventory counts through scans completed during each visit and may accurately identify the spent/failed batteries or cores to ensure a tightly closed loop recycling program. An RSM handheld device may connect to hub 140 and may download the most recent battery testing data from the testers since the dealer was last seen. It should be appreciated that this may inform the RSM as to prizes and giveaways from testing competitions that may be developed. It should further be appreciated that this information may be overlaid on top of recent sales data for the dealer determining how to increase sales. The RSM handheld device may, once back at a distributor's warehouse, upload that test data by a dealer to an office's data repository/servers and may provide duplication of testing data.

Hub 140 itself may communicate information back to office servers on a regular basis and may provide real-time testing data. It should be appreciated that data may be sent out or made available to a distributor and dealer base. It should also be appreciated that data may inform an online dealer portal and mobile application. Hub 140 may communicate real-time testing data to a system that may include sales and information kiosk 195 that may be used in the lobby of dealers to communicate different battery failure modes to educate a customer. The system may also be used with other third-party vendors to display information to the consumer in the lobby where the system may be provided.

It may be advantageous to set forth definitions of certain words and phrases used in this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A battery ecosystem, comprising:
   a hub provided to communicate with at least one of a battery monitor and a handheld tester,
   wherein the handheld tester performs a battery test, a system test, and a charging test, and wherein the handheld tester scans serialized labels that are capable of allowing a direct to consumer (D2C) engagement and are capable of supporting direct to business (D2B) applications,
   wherein the hub provides real-time data from the at least one of the battery monitor and the handheld tester to a distributor and dealer base, and
   wherein the handheld tester is capable of automatically ordering a battery directly through the distributor and dealer base when testing of the battery indicates the battery tests poorly or is dead.

2. The battery ecosystem according to claim 1, further comprising:
   a reserve capacity testing (RCT) module provided to communicate with the handheld tester and one or more mobile devices, wherein the one or more mobile devices communicate information to the hub directly.

3. The battery ecosystem according to claim 2, wherein the one or more
   mobile devices communicate information to at least one of consumers and businesses.

4. The battery ecosystem according to claim 1, further comprising:
   a printer provided to communicate with the hub.

5. The battery ecosystem according to claim 1, wherein the battery monitor constantly reads input and output information from the hub.

6. The battery ecosystem according to claim 1, wherein the hub may be provided or connected to a third-party device or system.

7. The battery ecosystem according to claim 1, wherein the handheld tester includes at least one of a scanner and a camera to capture information related to a vehicle or a battery.

8. The battery ecosystem according to claim 1, wherein the handheld tester includes a scanner and a camera to capture information related to a vehicle or a battery.

9. The battery ecosystem according to claim 1 wherein the battery monitor automatically monitors input and output readings to determine whether off-key drain or warranty abuse occurs.

10. A method of operating a battery ecosystem, comprising the steps of:
    communicating information to and from a hub, wherein at least one of a battery monitor and a handheld tester are wirelessly connected to the hub to send and receive information to and from the hub;
    providing real-time data from the hub to a distributor and dealer base; and
    automatically ordering a new or replacement battery directly through the distributor and dealer base when a battery tests poorly or is dead, wherein a closed loop algorithm is utilized to test the battery and order the new or replacement battery.

11. The method according to claim 10, further comprising:
    constantly reading the information communicated to and from the hub, wherein the battery monitor constantly reads the information.

12. The method according to claim 10, further comprising:
    applying serialized labels and radio-frequency identification (RFID) chips to products.

13. The method according to claim 10, further comprising:
    connecting a Route Sales Manager (RSM) handheld device to the hub, wherein a Bluetooth connection and a Wi-Fi connection allow the RSM handheld device to communicate with the hub.

14. The method according to claim 10, further comprising:

connecting a wireless tire tread measuring device to the hub, wherein a Bluetooth and a Wi-Fi connection allow the wireless tire tread measuring device to communicate with the hub.

15. The method according to claim 10, further comprising:

providing a third-party connection from the hub.

16. The method according to claim 10, further comprising:

automatically communicating a radio-frequency identification (RFID) tag or another scannable tag associated with the battery to the handheld tester and a route sales manager.

17. The method according to claim 10, further comprising:

encoding a manufacturing date on the RFID a radio-frequency identification tag or the another scannable tag.

18. The method according to claim 10, further comprising:

accurately measuring a value of cold-cranking amps (CCA) of the battery with the handheld tester.

* * * * *